(12) United States Patent
Iriguchi

(10) Patent No.: US 7,073,542 B2
(45) Date of Patent: Jul. 11, 2006

(54) LIQUID QUANTITY DETERMINATION UNIT, PHOTOLITHOGRAPHY APPARATUS, AND LIQUID QUANTITY DETERMINATION METHOD

(75) Inventor: Chiharu Iriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 465 days.

(21) Appl. No.: 10/394,034

(22) Filed: Mar. 24, 2003

(65) Prior Publication Data

US 2004/0103950 A1    Jun. 3, 2004

(30) Foreign Application Priority Data

Apr. 4, 2002 (JP) ............................. 2002-103064

(51) Int. Cl.
*B65B 1/04* (2006.01)
*B65B 1/30* (2006.01)
*G03B 27/54* (2006.01)
*G03B 27/32* (2006.01)
*G03H 1/00* (2006.01)
*G02B 1/06* (2006.01)
*G02B 17/00* (2006.01)

(52) U.S. Cl. ........................... 141/2; 141/83; 355/67; 355/77; 359/31; 359/665; 359/733; 356/73.1; 356/124; 356/239.2

(58) Field of Classification Search ............... 141/2; 359/31, 665, 733; 356/73.1, 124, 239.2
See application file for complete search history.

(56) References Cited

U.S. PATENT DOCUMENTS 4,764,969 A * 8/1988 Ohtombe et al. ............ 382/148
5,257,128 A * 10/1993 Diller et al. ................. 359/395

OTHER PUBLICATIONS

Clube, Francis et al., "Large-field, high-resolution photolithography", *SPIE*, vol. 3099, pp. 36-45.

* cited by examiner

*Primary Examiner*—W. B. Perkey
*Assistant Examiner*—Vivian Nelson
(74) *Attorney, Agent, or Firm*—Oliff & Berridge, PLC

(57) ABSTRACT

The invention automates determination of the quantity of a index matching liquid.

The invention is a liquid quantity determination unit to determine the quantity of a filling liquid to be filled between a plurality of optical components, and includes an inspection beam emitting unit to emit an inspection beam substantially vertically to an opposed surface of one of a pair of the optical components facing each other with the filling liquid interposed therebetween, a transporting unit to transport the inspection beam emitting unit to emit the inspection beam to a desired inspection point on the opposed surface, a reflecting point identifying unit to identifying the reflecting point of the inspection beam based on a reflected beam of the inspection beam emitted from the inspection beam emitting unit toward the opposed surface, and a determination unit to determine the presence or absence of the filling liquid at the inspection point based on the reflecting point determined by the reflecting point identifying unit.

13 Claims, 10 Drawing Sheets

LIQUID QUANTITY DETERMINATION UNIT, PHOTOLITHOGRAPHY APPARATUS, AND LIQUID QUANTITY DETERMINATION METHOD

BACKGROUND OF THE INVENTION

1. Field of Invention

The present invention relates to a holographic photolithography apparatus to perform exposing using a hologram. More specifically, the invention relates to an apparatus to determine a quantity of filling liquid, such as index matching liquid or the like, to be used to bring a hologram mask into intimate contact with a prism, and filling the same.

2. Description of Related Art

A related art patterning process of a semiconductor device utilizes TIR (Total Internal Reflection) holographic exposure technology. This exposure technology includes a recording process in which a desired pattern is recorded on the hologram mask, and an exposing process in which regenerating light is irradiated on the hologram mask to expose a photoresist for a semiconductor pattern.

In the recording process, a recording beam, which is a laser beam, is irradiated onto a mask pattern (reticle) corresponding to a pattern of the semiconductor device to generate deflected light and emit the deflected light onto a recording surface of the hologram mask. On the other hand, a reference beam is irradiated from the rear of the hologram mask at a constant angle with respect to the recording surface of the hologram mask to interfere with the deflected light from the reticle. Accordingly, an interference pattern is generated on the recording surface of the hologram mask, which is recorded on the hologram recording surface.

In the exposing process, the hologram mask is placed at the same position as the reticle, and an exposure beam, which is the regenerating light, is irradiated from the opposite direction from the direction of irradiation for recording, and the deflected light, in which the original pattern is reproduced, is focused onto the photoresist.

Since the interference pattern, which is a specific reticle pattern, is recorded on the hologram mask, it is necessary to remove the hologram mask from the prism every time the pattern to be exposed is changed and bring a new hologram mask into intimate contact with the prism. In the related art, filling liquid whose optical characteristics can be adjusted to prevent it from affecting the refractive index, which is referred to as index matching liquid, can be used to bring the hologram mask into intimate contact with the prism.

SUMMARY OF THE INVENTION

However, there is a problem in that the index matching liquid evaporates gradually when being exposed for a long time, since it is volatile, and thus exposure cannot be performed correctly. Therefore, it has been necessary to stop exposing at suitable times, check the quantity of the index matching liquid remaining, and if the amount is not sufficient, replenish the liquid.

In particular, when the hologram mask is attached to the prism, the hologram mask is placed inside a holographic photolithography apparatus, and thus it is difficult to visually check the amount of index matching liquid before exposure.

In addition, not only checking the quantity of the index matching liquid, but also frequent replenishment of the index matching liquid has also been a troublesome operation. It is therefore desirable to avoid the need to replenish the index matching liquid at least during the continuous exposing steps.

In view of the above, the present invention provides a liquid quantity determination unit which can automatically determine the amount of filling liquid between the optical components automatically, and a photolithography apparatus using the same.

The present invention also provides a filling liquid storage unit which requires a reduced number of times of replenishments of the filling liquid.

The present invention is a liquid quantity determination unit to determine the amount of filling liquid to be filled between a plurality of optical components, including: an inspection beam emitting unit to emit an inspection beam substantially vertically to an opposed surface of one of a pair of optical components facing each other with the filling liquid being interposed therebetween; a transporting unit to transport the inspection beam emitting unit to allow the inspection beam emitting unit to emit the inspection beam to a desired inspection point on the opposed surface; a reflecting point identifying unit to identify the reflecting point of the inspection beam based on a reflected beam of the inspection beam emitted from the inspection beam emitting unit toward the opposed surface; and a determination unit to determine the presence or absence of the filling liquid at the inspection point based on the reflecting point identified by the reflecting point identifying unit.

The determination unit in this case may determine that one of the pair of optical components, which should be opposed, is not mounted when the reflecting point identified when the inspection point is at the central area of the opposed surface satisfies predetermined conditions.

The determination unit may also determine whether or not the quantity of the filling liquid is sufficient based on whether or not the reflecting point which is identified when the inspection point is at the peripheral area of the opposed surface satisfies predetermined conditions.

The liquid quantity determination unit may further include a filling liquid supplying unit to supply the filling liquid between the pair of optical components. In this case, the filling liquid supplying unit supplies a predetermined quantity of filling liquid between the optical components when the determination unit determines that the quantity of the filling liquid is not sufficient.

The determination unit may determine whether or not the quantity of the filling liquid is sufficient for each of a plurality of inspection points on the opposed surface. In this case, the filling liquid supplying unit determines the quantity of filling liquid to be supplied based on the distribution of the inspection points which are determined to have an insufficient quantity of filling liquid.

The determination unit may determine whether or not the quantity of the filling liquid is sufficient for each of the plurality of inspection points around a predetermined area on the opposed surface. In this case the filling liquid supplying unit supplies the filling liquid when it is determined that there is an inspection point which is determined to have an insufficient quantity of the filling liquid.

The present invention is a filling liquid storage unit to supply a filling liquid to be filled between a plurality of optical components, including: a tank to supply the filling liquid, the tank being mounted at an area where the plurality of optical components are in abutment with each other while aligning the side surfaces thereof, with a space to be filled with the filling liquid being interposed therebetween; and a storage section provided in the tank to store the filling liquid, the storage section being opened toward the end of the space at the area.

The present invention is a filling liquid storage unit to supply a filling liquid between a plurality of optical components, including: an extension plate, the extension plate being mounted at an area where the plurality of optical components are in abutment with each other while arranging the side surfaces on the different levels, with a space to be filled with the filling liquid being interposed therebetween; the extension plate being overhung from the side surface of one of the optical components toward the portion of the optical components arranged on the different levels; and the filling liquid can be stored in a room defined by the extension plate, the bottom of one optical component, and the side surface of the other optical component.

The present invention is a filling liquid storage unit to supply a filling liquid between a plurality of optical components, including: a plurality of optical components being arranged on the different levels, with a space to be filled with the filling liquid being interposed therebetween, the lower optical component thereof being projected at a shelf; and an overflow preventing fence for the filling liquid being provided on the side surface of the shelf. The filling liquid stored in a storage space defined by the shelf and the overflow preventing fence can be supplied from the end of the space opening toward the storage space.

The liquid quantity determination unit may further be provided with the filling liquid storage unit of the present invention. In this case, it is constructed in such a manner that the filling liquid is supplied from the filling liquid supplying unit to the filling liquid storage unit.

The present invention may also be a photolithography apparatus including the liquid quantity determination unit of the present invention, the hologram mask, which is one of the optical components, and an irradiating unit to irradiate the exposure beam to the hologram mask to expose the exposure area.

The present invention is also a liquid quantity determination method suitable for being implemented by the liquid quantity determination unit. In other words, the present invention is a liquid quantity determination method to determine the quantity of a filling liquid to be filled between a plurality of optical components, including: emitting an inspection beam substantially perpendicular to an opposed surface of one of the pair of optical components facing each other, with the filling liquid being interposed therebetween, emitting the inspection beam to an arbitrary inspection points on the opposed surface, identifying a reflecting point of the inspection beam based on a reflected beam of the inspection beam emitted toward the opposed surface, and determining the presence of the filling liquid at the inspection point based on the identified reflecting point.

The determining may determine that one of the pair of optical components, which should be opposed, is not mounted when the reflecting point identified when the inspection point is at the central area of the opposed surface satisfies predetermined conditions.

The determining may also determine whether or not the quantity of the filling liquid is sufficient based on whether or not the reflecting point identified when the inspection point is at the peripheral area of the opposed surface satisfies predetermined conditions.

The liquid quantity determining method of the present invention may further include: supplying the filling liquid between the pair of optical components. In this case, the method can include supplying a predetermined quantity of filling liquid between the optical components when it is determined, in the determining step, that the quantity of the filling liquid is not sufficient.

The determining may also determine whether or not the quantity of the filling liquid is sufficient for each of a plurality of inspection points on the opposed surface. In this case, the supplying the filling liquid determines the quantity of filling liquid to be supplied based on distribution of the inspection points, which are determined to have insufficient quantity of filling liquid.

The determining may also determine whether or not the quantity of the filling liquid is sufficient for each of the plurality of inspection points around the predetermined area in the opposed surface. In this case, in the supplying, the filling liquid is supplied when it is determined that there is at least one inspection point which is determined to have insufficient quantity of the filling liquid.

DETAILED DESCRIPTION OF PREFERRED EMBODIMENTS

Figure 1:
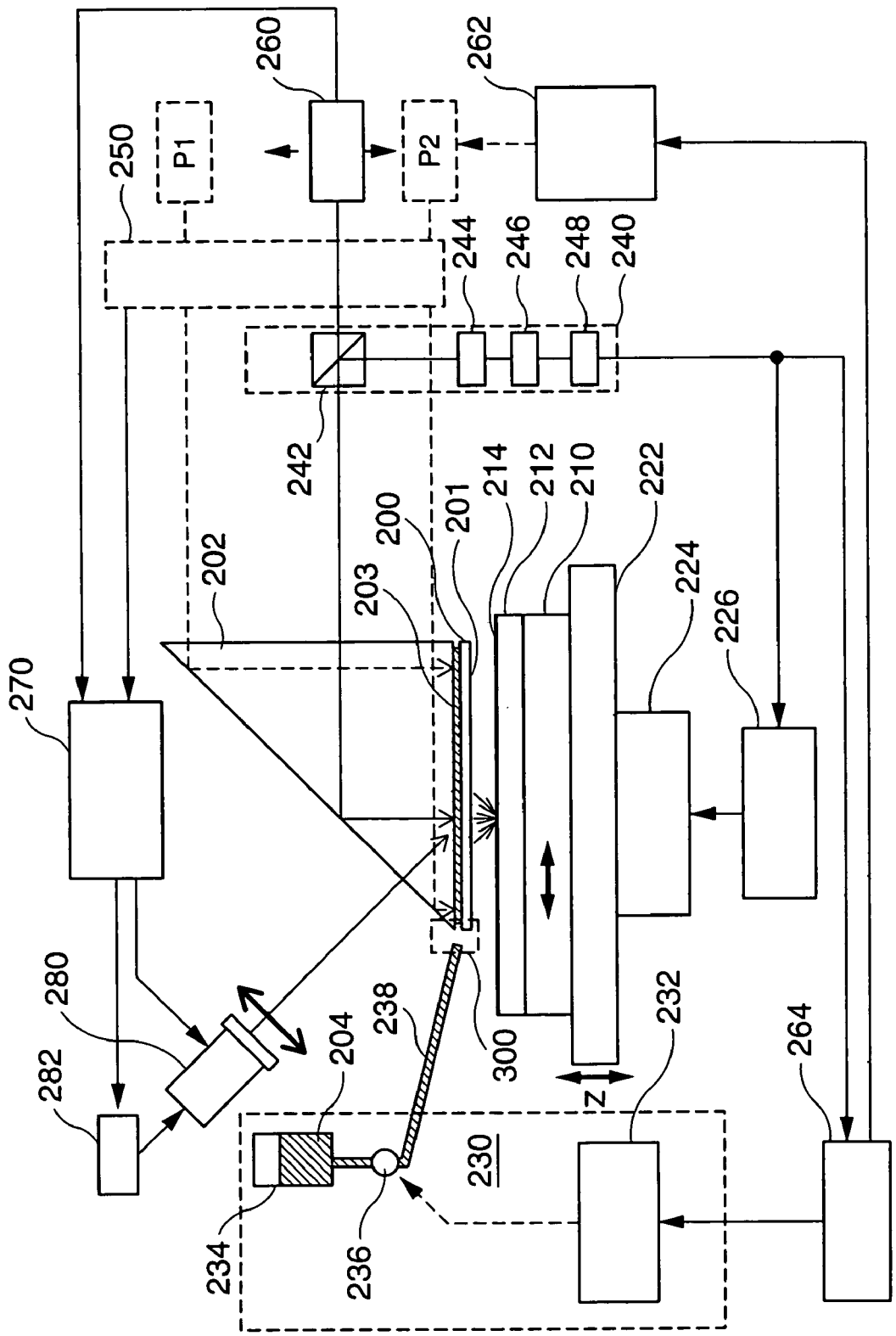
FIG. 1 is a schematic that shows the structure of a liquid quantity determination unit and a photolithography apparatus according to exemplary Embodiment 1.

Exemplary embodiments of the present invention are described below referring to the drawings.

Exemplary Embodiment 1

Exemplary Embodiment 1 of the present invention relates to a TIR holographic photolithography apparatus having a liquid quantity determination unit according to the present invention, and to a photolithography apparatus having inspection points to inspect the quantity of filling liquid on the peripheral portion of a hologram mask surface.

FIG. 1 shows a general structure of a TIR holographic photolithography apparatus according to exemplary Embodiment 1.

As shown in FIG. 1, the photolithography apparatus includes a prism 202, a stage unit 224 having a stage 222, a first information processing unit 226, a distance measuring optical system 240, a film thickness measuring optical system 250, a light source 260, a transporting unit 262, a second information processing unit 270, an exposure light source 280, an exposure light source drive unit 282, a third information processing unit 264, and a filling liquid supplying unit 230. A hologram mask 200 is in intimate contact with the prism 202, with a index matching liquid 204 (the filling liquid) being interposed therebetween.

The light source 260 relates to an inspection beam emitting unit of the present invention, and emits inspection beam for the distance measuring optical system 240 and the film thickness measuring optical system 250.

The transporting unit 262 relates to a transporting unit of the present invention, and transports the light source 260 so as to be capable of emitting an inspection beam to a desired inspection point on an opposed surface 203 of the prism 202, which opposes the hologram mask 200 with the index matching liquid 204 interposed therebetween. In other words, the transporting unit 262 is capable of transporting the light source to a desired position (P1, P2, or the direction perpendicular to the drawing) on the opposed surface 203 under the control of the third information processing unit 264, and thus the inspection beam emitted to the hologram mask 200 after reflection of the prism 202 can be perpendicularly supplied to the desired position on the opposed surface 203.

The distance measuring optical system 240 relates to part of the reflecting point identifying unit of the present invention, and includes a beam splitter 242, a cylindrical lens 244, an optical sensor 246, and an error signal detector 248, and is adapted to control the focus at exposure time by adjusting the distance between a recording surface of the hologram mask 200 and a photosensitive film surface 214 on an exposed substrate.

After the inspection beam emitted from the light source 260 is reflected by the prism 202 and then reflected by the opposed surface 203 with respect to the hologram mask 200 or the photosensitive film surface 214 of the exposed substrate 210, the beam splitter 242 changes an optical path of the reflected beam into the perpendicular direction.

The cylindrical lens 244 serves as a lens only in one of two directions perpendicular to the optical axis, and has no optical effect in the other direction, so that the focal distance, where a two-directionally symmetrical focusing shape is obtained, varies in accordance with the distance from the point of emission of the incident beam. Therefore, the symmetry properties of the shape of the reflected beam focusing onto the optical sensor 244 vary in accordance with the reflecting point at which the inspection beam from the light source 260 is reflected.

The optical sensor 244 is a photo-detector divided into four segments about the optical axis, and outputs electrical signals in accordance with the light intensity of the inspection beam coming into the respective photo-detector segments.

The error signal detector 248 calculates the difference between the electrical signals supplied from each photo-detector segment of the optical sensor 244 and outputs error signals.

The third information processing unit 264 is related to the reflecting point identifying unit and the determination unit of the present invention, and performs identification of the reflecting point and determination of the liquid quantity according to the invention based on the error signals.

The filling liquid supplying unit 230 includes a drive unit 232, a tank 234, a flow path pump 236, and a feed pipe 238, and supplies the index matching liquid 204 to a space between the prism 202 and the hologram mask 200 when the third information processing unit 264 determines that the quantity of index matching liquid is insufficient.

More specifically, the drive unit 232 outputs drive signals for a predetermined period of time based on control signals from the third information processing unit 264. The flow path pump 236 supplies the index matching liquid 204 for replenishment, which is stored in the tank 234, to the feed pipe 238 when the drive signals are emitted. The index matching liquid supplied to the feed pipe 238 is directly supplied to the space between the prism 202 and the hologram mask 200. However, it is also possible to supply the index matching liquid to the space via a filling liquid storage unit 300, which is described later below.

A description of the construction of other portions is provided below. The stage unit 224 holds the exposed substrate 210 having the photosensitive film 212 formed thereon on the stage 222 via a vacuum chuck or the like, and adjusts the position of the stage 222 at least in the vertical direction (the Z direction). The first information processing unit 226 sets the position of the stage 220 so that proper focus is achieved based on the distance between the hologram recording surface 201 and the photosensitive film surface 214 formed on the exposed substrate based on the error signals supplied from the distance measuring optical system 240. The film thickness measuring optical system 250 includes the beam splitter, the photo-detector, an amplifier, an A/D converter, and the like, and configured so as to measure the film thickness of the photosensitive film 212 formed on the exposed substrate 210. The second information processing unit 270 controls the exposure intensity based on the relative value of the film thickness of the photosensitive film 212 supplied from the film thickness measuring optical system 250. The exposure light source 280 irradiates an exposure beam to the hologram recording surface 202 of the hologram mask 200. The exposure light source drive unit 282 moves the exposure light source 280 so as to scan and expose a desired exposure area on the exposed substrate 210.

Referring now to a plan view of the opposed surface 203 shown in FIG. 2, the detection point according to the present embodiment is described below. Exemplary Embodiment 1 is provided such that the inspection point on the opposed surface 203, to which the inspection beam is emitted, is in the peripheral region of the opposed surface 203, as shown in FIG. 2.

Figure 2:
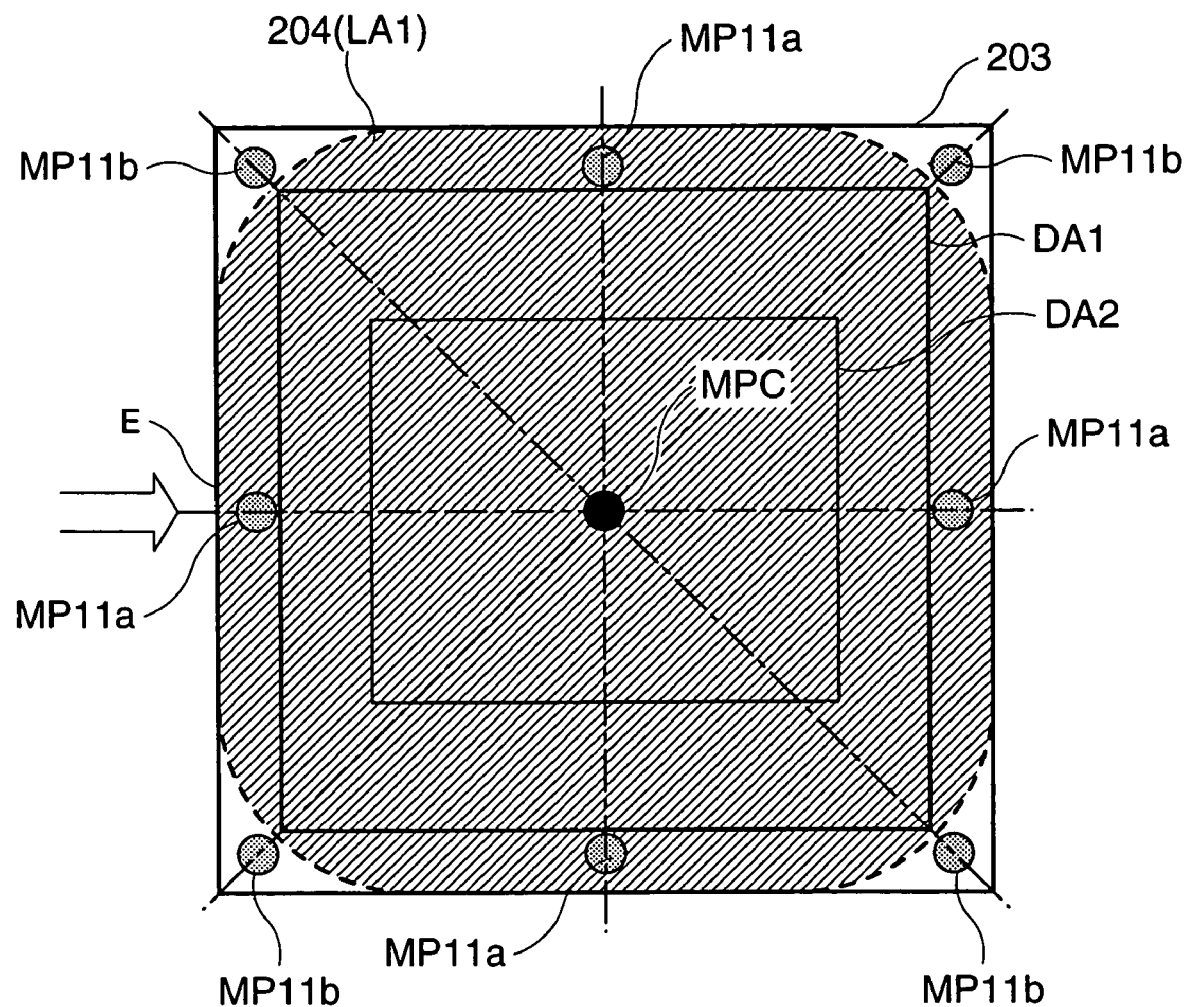
FIG. 2 is a plan view illustrating the arrangement of inspection points on an opposed surface for liquid quantity determination according to exemplary Embodiment 1.

In FIG. 2, an effective area DA1, which is obtained by adding a margin from an exposure area DA2 on which the reticle pattern is regenerated, is arbitrarily determined. The index matching liquid can be supplied from the position E. As indicated by a broken line, the index matching liquid 204 is gradually evaporated around the contact surface (a space) between the prism and the hologram mask, and the filling liquid area LA1 is thus reduced in size. In this exemplary embodiment, it is determined whether or not the filling liquid area LA1 is decreased to a size smaller than the effective area DA1. In other words, as shown in FIG. 2, the detection points MP11*a* and *b* detected by the inspection beam are set to the peripheral area of the opposed surface 203.

Only one of the plurality of detection points may be detected, some of them may be detected, or indeed all of them may be detected. For example, at the detection point MP11*a* on a diagonal line on the opposed surface 203, since the distance from the center point MPC is significant, it is considered that the index matching liquid evaporates rather quickly. Therefore, an insufficient quantity of the index matching liquid can be detected when the evaporated quantity of the index matching liquid is not so much in relatively early stages. On the other hand, at the central portion of the side of the opposed surface 203, it is considered that an insufficient liquid quantity is detected slightly late in comparison with insufficient liquid quantity on the diagonal line.

Figure 3:
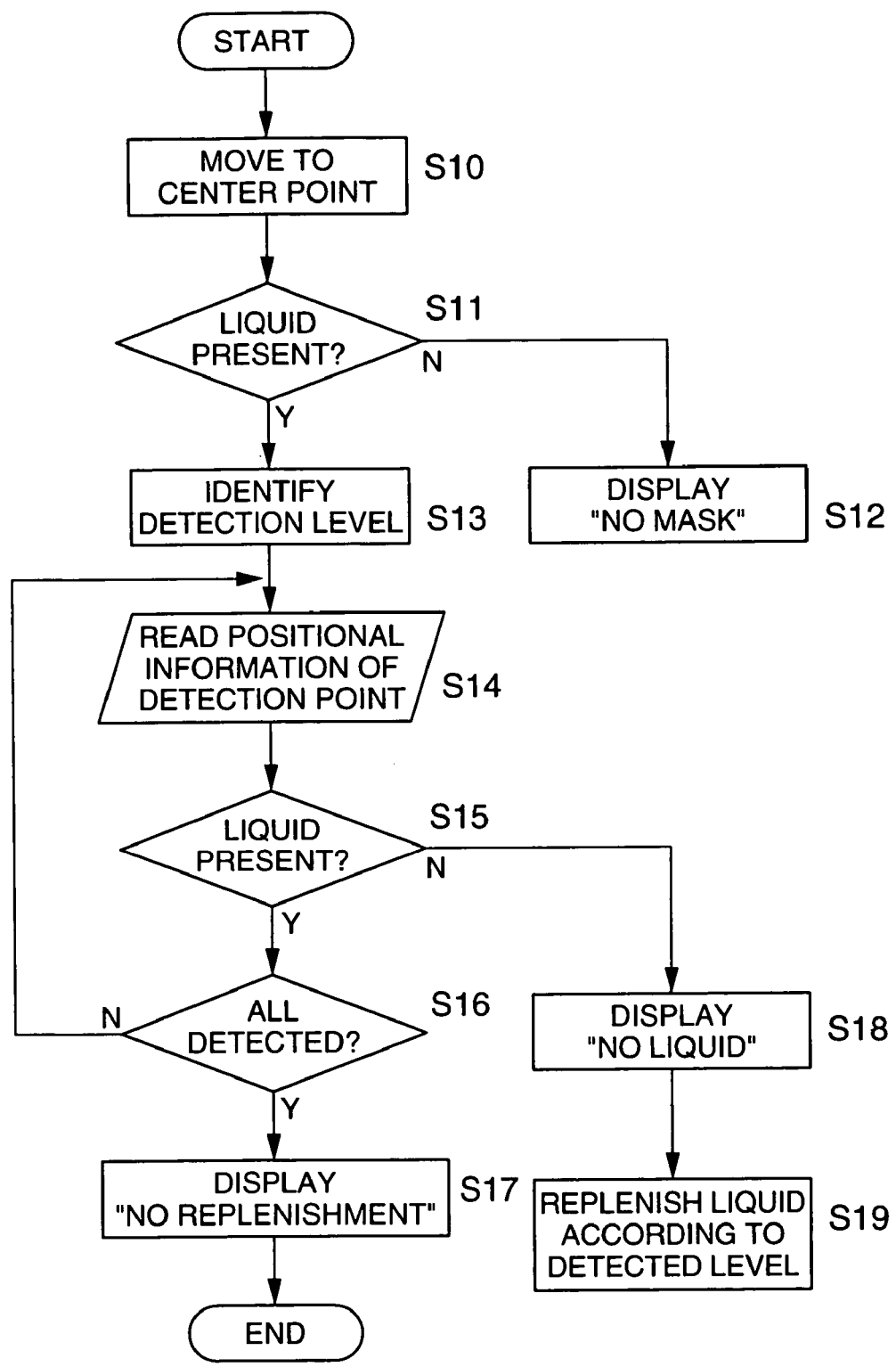
FIG. 3 is a flowchart illustrating a liquid quantity determining method according to exemplary Embodiment 1.

Referring now to a flowchart shown in FIG. 3, a liquid quantity determination processing operation of exemplary Embodiment 1 is described below. The liquid quantity determination processing may be set to be performed at the beginning of the exposing process by the present holographic photolithography apparatus, or alternatively, to be performed periodically, independently of the exposing process so as to prevent the index matching liquid from running short when not in use.

Prior to inspection, the third information processing unit 264 controls the transporting unit 262 to move the light source 260 so that the detection beam can be emitted to the center point MPC of the opposed surface 203 of the prism 202 (S10). If the hologram mask 200 is mounted to the prism 202 via the index matching liquid, the detection beam is not reflected by the opposed surface 203, but instead reaches the hologram recording surface 201, where part of it is reflected, and most of it is reflected by the photosensitive film surface 214 of the exposed substrate 210. If the hologram mask is mounted to the prism, the index matching liquid must be present at least in the vicinity of the center of the opposed surface. Therefore, the third information processing unit 264 determines that no index matching liquid is present, that is, the hologram mask is not mounted (S11:N) when the error signals emitted from the distance measuring optical system 240 indicate that the entire detection beam is reflected by the opposed surface 203, and causes a display unit or a lamp (not shown) to indicate that fact (S12).

When it is determined that the hologram mask is mounted (S11:Y), the third information processing unit 264 identifies the detection level, which is stored or entered in a memory in advance (S13). The detection level means a level to determine when to issue an alarm with respect to the reduction of the boundary LA1 of the filling liquid. For example, as described in conjunction with FIG. 2, the detection point MP11b is set to the area in the vicinity of the diagonal line on the opposed surface 203 in order to issue the alarm in relatively early stages, and it is set to the detection point MP11a in order to increase the allowable level evaporation of the index matching liquid.

Subsequently, determination of the liquid quantity will be described. The third information processing unit 264 first controls the transporting unit 262, reads the positional information on each preset detection point (S14), and causes the detection beam to be emitted to the detection points on the opposed surface 203 identified by the positional information. Then, the presence or absence of the index matching liquid is determined, as in the case described above, based on the error signals supplied from the distance measuring optical system 240. If the index matching liquid is present at the detection point thereof, the detection beam is not reflected by the detection point, but instead reaches the hologram mask 200. In contrast, if no more index matching liquid remains at the detection point because it has evaporated, the detection beam is reflected by the detection point. When the error signals indicate another position other than the opposed surface as the reflecting point of the detection beam (S15:Y), it is determined that there is index matching liquid at the detection point, and thus the procedure advances to detection of the next detection point (S16:N). When the presence or absence of the index matching liquid has been determined at all the detection points (S14–S16) and it is determined that index matching liquid exists at all the detection points (S16:Y), the third information processing unit 264 displays a notification indicating that no replenishment is necessary, as needed (S17), and terminates the liquid quantity determination processing. Subsequently, the procedure advances to the exposing process, if required. On the contrary, when it is determined that no index matching liquid exists at some detection points (S15:N), it displays a notification indicating that the index matching liquid is missing, if required (S18).

When it is determined that the index matching liquid is missing (S18), the index matching liquid may be manually replenished by an operator upon seeing the notification. However, according to the present exemplary embodiment, the index matching liquid is replenished by the filling liquid supplying unit 230 (S19). In other words, the third information processing unit 264 makes reference to the detection level, determines the quantity of the index matching liquid to be replenished, and drives the drive unit 232 for a period according to the required liquid quantity to actuate the flow path pump 236. The index matching liquid is supplied from the tank 234 to the space between the prism 202 and the hologram mask 200 for the period during which the flow path pump 236 is in operation. It is also possible to perform the determination of the liquid quantity at the same detection point again after the index matching liquid is supplied to check whether or not a sufficient quantity of the index matching liquid was supplied. It is also possible to feedback the results of the determination of the liquid quantity to stop the flow path pump as soon as the liquid quantity is restored, instead of determining the driving period of the flow path pump 236 in advance.

As described thus far, according to exemplary Embodiment 1, it is determined that one of the optical components which should oppose each other is not mounted if the reflecting point identified when the detection point is set in the area in the vicinity of the center of the opposed surface satisfies predetermined conditions. Therefore, an alarm to signal that the hologram mask should be mounted can be issued. In addition, the presence of the hologram mask can be checked prior to the determination of the liquid quantity.

According to exemplary Embodiment 1, since the determination of the liquid quantity is made in the peripheral region of the opposed surface, lack of the index matching liquid can be detected in relatively early stages.

According to exemplary Embodiment 1, since a suitable quantity of the index matching liquid is supplied by the filling liquid supplying unit after lack of the liquid quantity is determined, supply of the index matching liquid is automated, and thus manual replenishment of the index matching liquid, which is difficult to carry out, may be eliminated.

Exemplary Embodiment 2

Exemplary Embodiment 2 of the present invention relates to a holographic photolithography apparatus which is similar to the aforementioned exemplary Embodiment 1, and to a photolithography apparatus for performing determination of the quantity of the filling liquid for a plurality of detection points and determining the quantity of the filling liquid to be supplied based on the distribution of the detection points determined to be running short of the liquid.

Since the construction of the holographic photolithography apparatus according to exemplary Embodiment 2 is the same as exemplary Embodiment 1, a description thereof is omitted.

Referring now to a plan view of the opposed surface 203 shown in FIG. 4, inspection points of the present exemplary embodiment is described below. Exemplary Embodiment 2 is provided such that a plurality of detection points, to which the detection beam is emitted, are disposed inside the opposed surface 203.

Figure 4:
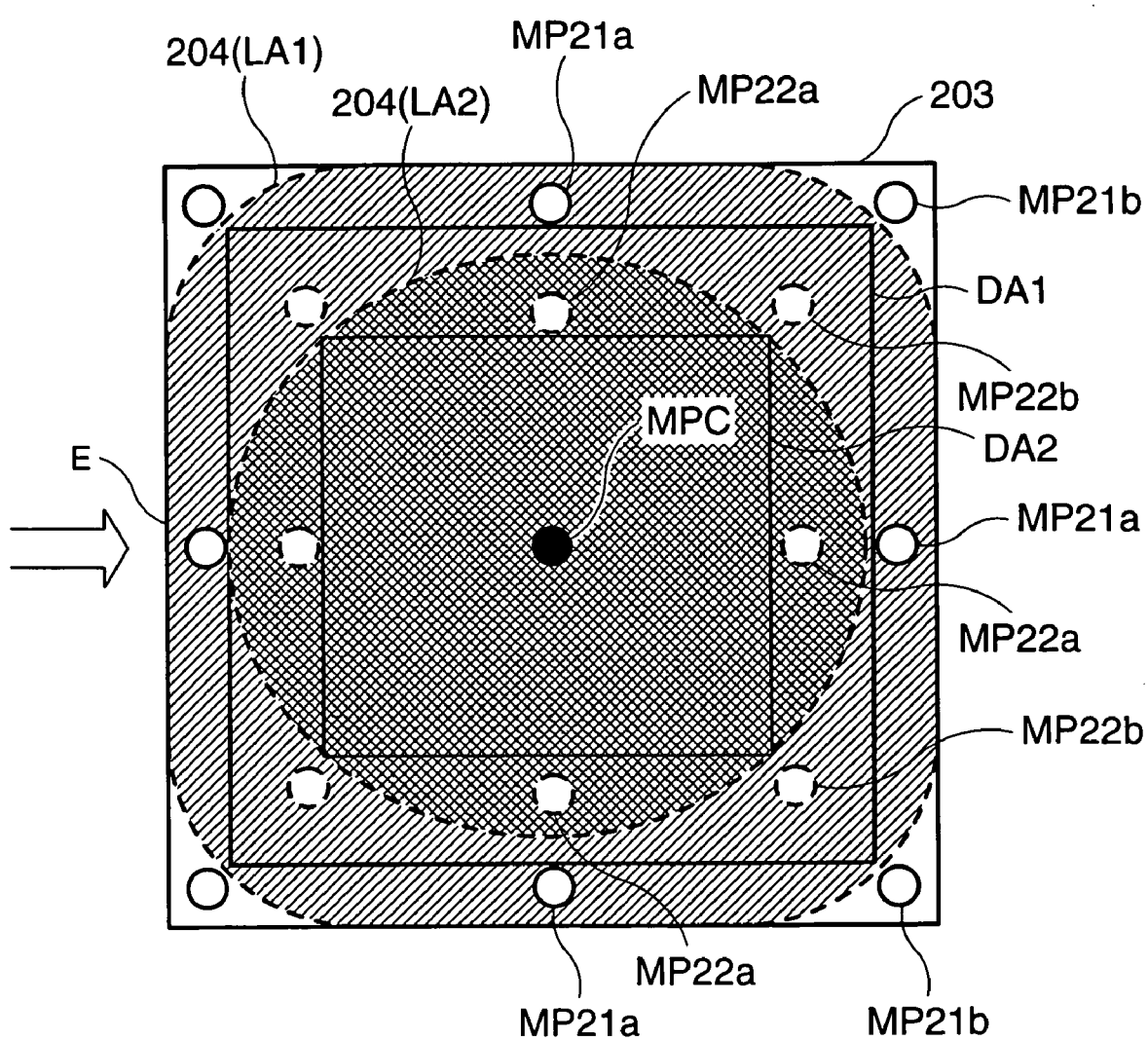
FIG. 4 is a plan view illustrating the arrangement of inspection points on the opposed surface for liquid quantity determination according to exemplary Embodiment 2.

In FIG. 4, the effective area DA1, which is obtained by adding a margin from the exposure area DA2 on which the reticle pattern is regenerated, is arbitrarily determined. In order to sufficiently distribute the index matching liquid over the entire effective area DA1, the index matching liquid must occupy at least the filling liquid area LA1. In order to perform an exposing operation of the exposure area DA2, the index matching liquid must be present at least in the filling liquid area LA2. Therefore, in exemplary Embodiment 2, the inspection points MP21a and MP21b, and MP22a and Mp22b are provided inside and outside the filling liquid area LA1 and LA2 so that control in accordance with the quantity of evaporation of the index matching liquid can be performed. Then, the quantity of the index matching liquid to be replenished is varied in accordance with distribution of the inspection points determined to be running short of the liquid. For example, as shown in Table 1, the quantity of liquid to be replenished can be determined in accordance with the detection points, which are determined to be running short of the liquid.

TABLE 1

| DETECTION POINT | LIQUID QUANTITY TO BE REPLENISHED | TYPE OF ALARM |
| --- | --- | --- |
| MP21b | none | no alarm |
| MP21a | little | missing quantity small |
| MP22b | medium | missing quantity medium |
| MP22a | large | missing quantity large |
| MPC | none | no mask |

The detection points shown in FIG. 4 are given just as examples, and they can be changed, if required. For example, only some of the plurality of detection points may be detected, or all of them may be detected. For example, since it is considered that the detection points located on the opposed surface at the positions geometrically symmetric with respect to the central axis are filled with the filling liquid to the same extent when the bottom surface of the prism is geometrically symmetrical in shape with respect to the central axis, detection of one of them can be omitted.

Figure 5:
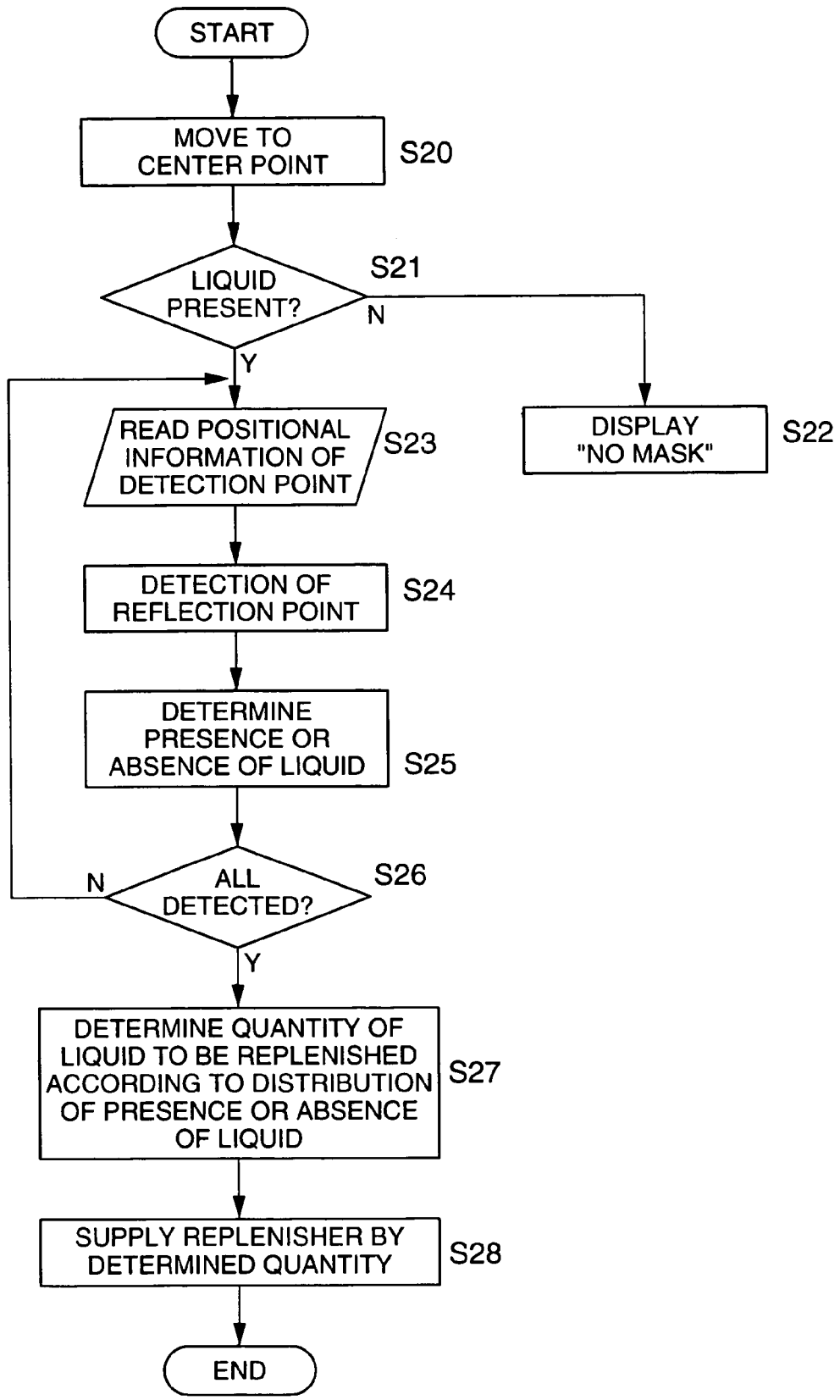
FIG. 5 is a flowchart illustrating the liquid quantity determining method according to exemplary Embodiment 2.

Subsequently, referring to a flowchart in FIG. 5, a liquid quantity determination processing operation of exemplary Embodiment 2 is described below. The liquid quantity determination processing may be set to be performed at the beginning of the exposing process by the present holographic photolithography apparatus, or alternatively, to be performed periodically, independently of the exposing process, so as to prevent the index matching liquid from running short when not in use.

Prior to inspection, the third information processing unit 264 controls the transporting unit 262 to move the light source 260 so that the inspection beam can be emitted to the center point MPC of the opposed surface 203 of the prism 202 (S20). If the hologram mask 200 is mounted to the prism 202 via the index matching liquid, the detection beam is not reflected by the opposed surface 203, but instead reaches the hologram recording surface 201, where part of it is reflected, and most of it is reflected from the photosensitive film surface 214 of the exposed substrate 210. If the hologram mask is mounted to the prism, the index matching liquid must be present at least in the vicinity of the center of the opposed surface. Therefore, the third information processing unit 264 determines that the index matching liquid is not present, that is, the hologram mask is not mounted (S21:N) when the error signals emitted from the distance measuring optical system 240 indicates that the entire detection beam is reflected by the opposed surface 203, and causes a display unit or a lamp (not shown) to indicate that fact (S22: See Table 1).

When it is determined that the hologram mask is mounted (S21:Y), the procedure goes to determination of the liquid quantity. The third information processing unit 264 first controls the transporting unit 262, reads the positional information on each preset detection point (S23), and causes the detection beam to be emitted to the detection points on the opposed surface 203 identified by the positional information. Then, the reflection point is detected based on the error signals supplied from the distance measuring optical system 240 (S24) and the presence or absence of the index matching liquid is determined corresponding thereto (S25). If the index matching liquid is present at the detection point thereof, the detection beam is not reflected by the detection point, but instead reaches the hologram mask 200. In contrast, if no more index matching liquid is left at the detection point because it is evaporated, the detection beam is reflected by the detection point. When determination of the liquid quantity at one detection point is completed, the obtained result is stored, and the procedure goes to determination of the liquid quantity at the next detection point (S26:N). When the presence or absence of the index matching liquid at all the detection points is inspected (S23–S26), the third information processing unit 264 determines the quantity of the index matching liquid to be replenished in accordance with distribution of the detection points which are determined to be running short of the liquid quantity, and provides a corresponding alarm display (S27). For example, the third information processing unit uses the corresponding relation shown in Table 1.

When it is determined that replenishment of the index matching liquid is necessary, the index matching liquid may be replenished manually by an operator. However, in the present exemplary embodiment, the index matching liquid may also be replenished by the filling liquid supplying unit 230 (S28). In other words, the third information processing unit 264 determines the quantity of the index matching liquid to be supplied based on distribution of the detection points, which are determined to be running short of the liquid quantity as shown in Table 1, and drives the drive unit 232 for a period in accordance with the liquid quantity to actuate the flow path pump 236. The index matching liquid is supplied from the tank 234 to the space between the prism 202 and the hologram mask 200 for the period during which the flow path pump 236 is in operation. It is also possible to perform the determination of the liquid quantity at the same detection point again after the index matching liquid is supplied to check whether or not a sufficient quantity of the index matching liquid has been supplied.

According to exemplary Embodiment 2, since it is determined that one of the optical components which should be opposed is not mounted when the reflecting point which is identified when the inspection point is at the central area of the opposed surface satisfies predetermined conditions, an alarm signaling that the hologram mask should be mounted can be issued. The presence of the hologram mask can be checked prior to determination of the liquid quantity.

According to exemplary Embodiment 2, since the distribution of the detection points which are determined to be running short of the liquid quantity is detected, the extent of the lack of index matching liquid can be notified directly, and thus the index matching liquid can be replenished according to the quantity of missing liquid.

In this case, since the filling liquid supplying unit supplies a suitable quantity of index matching liquid after the quantity of missing liquid is determined, supply of the index matching liquid may be automated, and thus manual replenishment of the index matching liquid, which is difficult to carry out, may be omitted.

Exemplary Embodiment 3

Exemplary Embodiment 3 of the present invention relates to a holographic photolithography apparatus, which is similar to exemplary Embodiment 1 described above, and to a photolithography apparatus to determine whether or not the liquid quantity is sufficient for each of the plurality of inspection points around the exposure area.

Since the construction of the holographic photolithography apparatus according to exemplary Embodiment 3 is the same as exemplary Embodiment 1, description is omitted.

Referring now to a plan view of the opposed surface 203 in FIG. 6, the detection point according to the present exemplary embodiment is described below. In exemplary Embodiment 3, it is assumed that the case in which partial exposure is performed. In other words, the exposure area DA to be exposed is set to a part of the area of the surface of the hologram mask. When the index matching liquid is present at least this exposure area, exposing operation can be performed. Therefore, the present exemplary embodiment is provided such that the lack of the liquid quantity is determined for the area around the intended exposure area DA.

Figure 6:
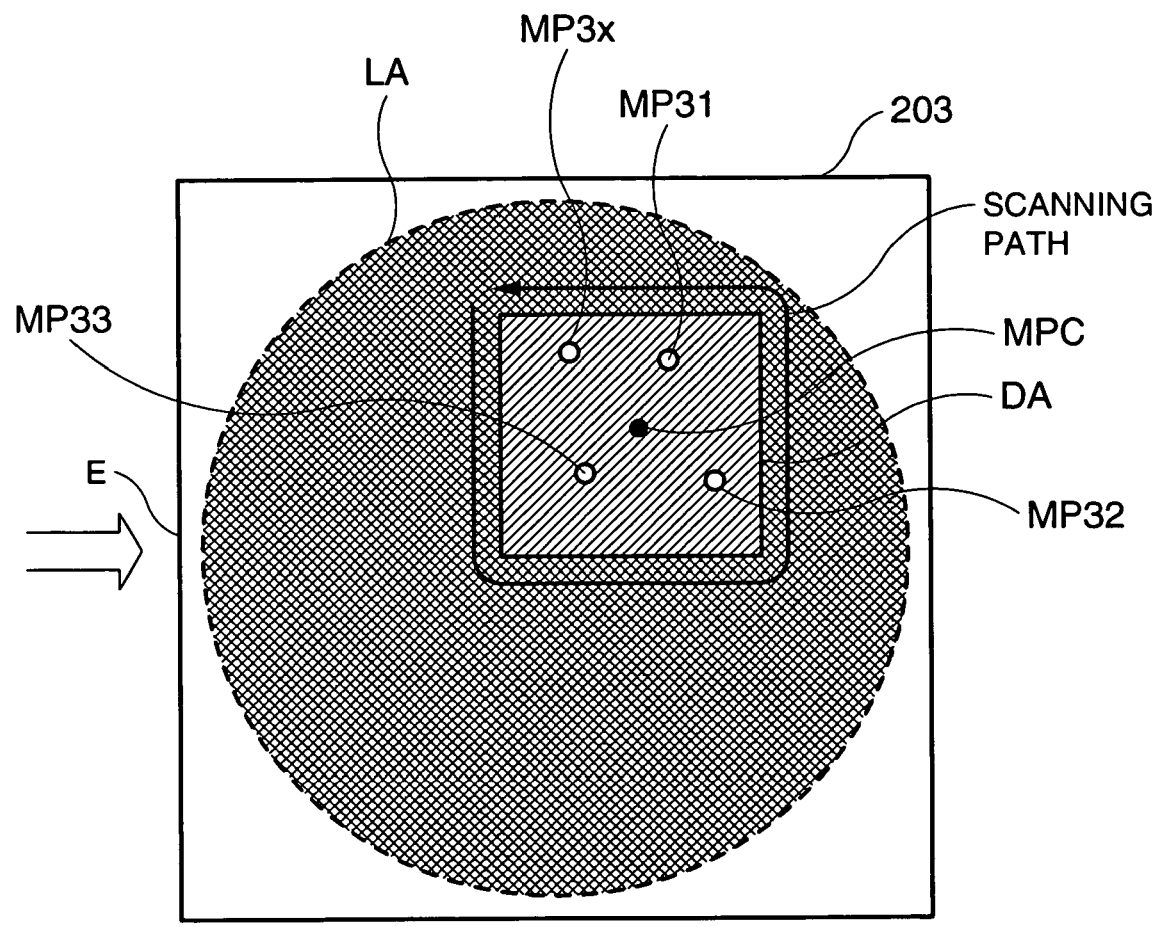
FIG. 6 is a plan view illustrating the arrangement of the inspection points on the opposed surface for determining the liquid quantity according to exemplary Embodiment 3.

In other words, in FIG. 6, the liquid quantity around the area of the exposure area DA, at which the reticle pattern is regenerated, is determined. In addition, the center point MPC of the exposure area DA or the arbitrary points in the exposure area, MP31, 32, . . . 3x may be set as the detection points, if necessary.

Figure 7:
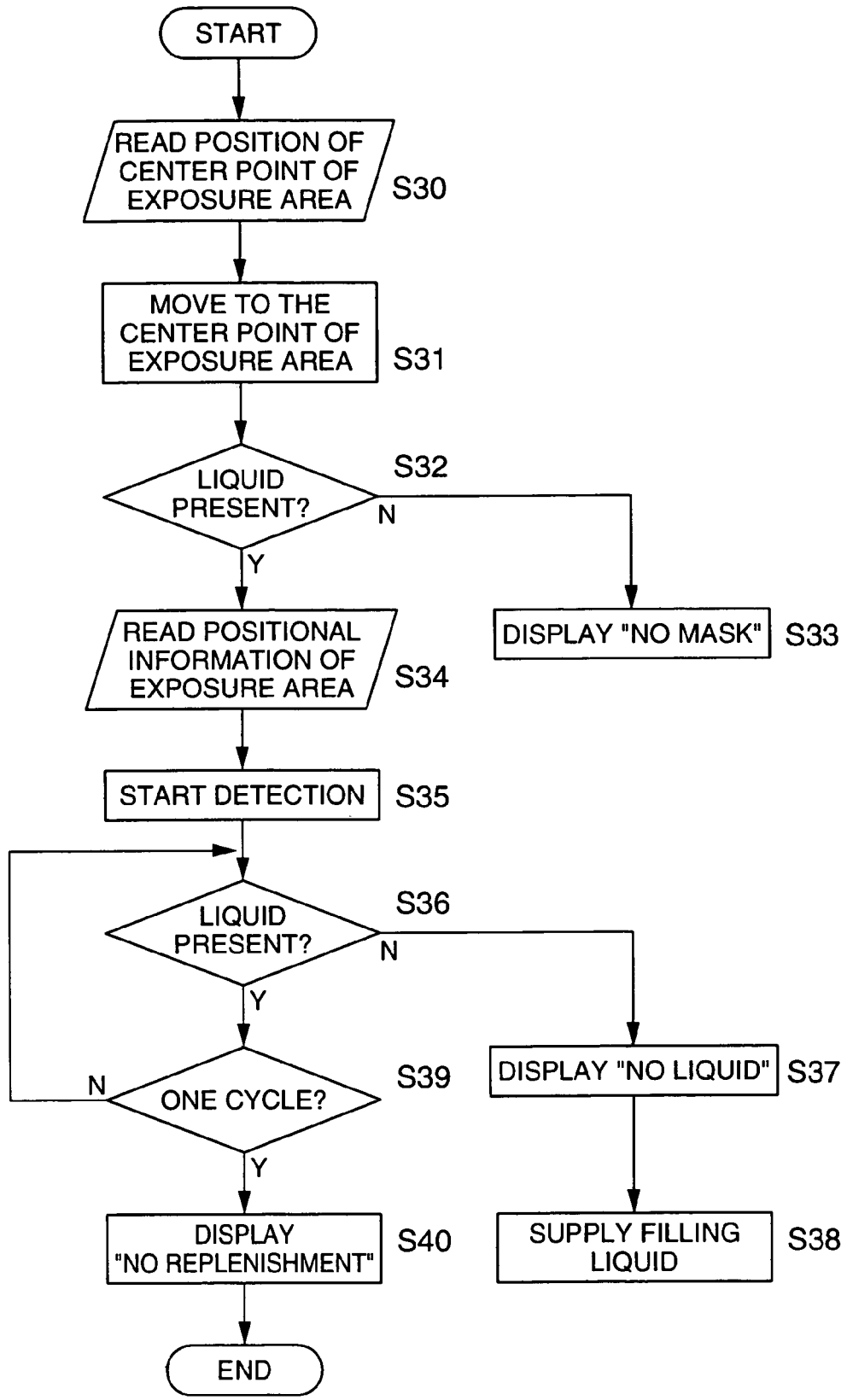
FIG. 7 is a flowchart illustrating the liquid quantity determining method according to exemplary Embodiment 3.

Subsequently, referring to a flowchart shown in FIG. 7, liquid quantity determination processing operation according to exemplary Embodiment 3 is described below. The liquid quantity determination processing may be set to be performed at the beginning of the exposing process by the present holographic photolithography apparatus, or alternatively, to be performed periodically, independently of the exposing process so as to prevent the machining liquid from running short when not in use.

Prior to inspection, the third information processing unit 264 reads positional information of the center point of the exposure area DA (S30), and controls the transporting unit 262 to move the light source 260 so that the detection beam can be emitted to the center point MPC of the exposure area DA (S31). If the hologram mask 200 is mounted to the prism 202 via the index matching liquid, the detection beam is not reflected by the opposed surface 203, but instead reaches the hologram recording surface 201, where part of it is reflected, and most of it is reflected by the photosensitive film surface 214 of the exposed substrate 210. If the hologram mask is mounted to the prism, the index matching liquid must be present at least in the vicinity of the center of the opposed surface. Therefore, the third information processing unit 264 determines that the index matching liquid is not present, that is, the hologram mask is not mounted (S32:N) when the error signals emitted from the distance measuring optical system 240 indicates that entire detection beam is reflected by the opposed surface 203, and causes a display unit or a lamp (not shown) to indicate that fact (S33).

When it is determined that the hologram mask is mounted (S32:Y), the procedure advances to the liquid quantity determination. The third information processing unit 264 reads the positional information of the exposure area DA (S34), then controls the transporting unit 262 to initiate the inspection in such a manner that the inspection beam scans the area around the exposure area DA (S35). As long as the liquid quantity is secured (S36:Y), determination of the liquid quantity is performed continuously based on the error signals until the detection beam comes full circle (S39:N). If the detection beam can come full circle around the exposure area DA without detection of an insufficient quantity of the liquid (S39:Y), it is considered that the liquid quantity is sufficient, and thus the display indicating that no replenishment is necessary is provided (S40) and the procedure is completed. The procedure advances to the exposing process, if required.

On the other hand, when it is determined that the liquid quantity is not sufficient at any points (S36:N), the display indicates that the liquid quantity is insufficient (S37). When it is determined that replenishment of the index matching liquid is necessary, the index matching liquid may be replenished manually by an operator. However, in the present exemplary embodiment, the index matching liquid is further replenished by the filling liquid supplying unit 230 (S38). In other words, the third information processing unit 264 drives the drive unit 232 for a period in accordance with the predetermined liquid quantity to actuate the flow path pump 236. The index matching liquid is supplied from the tank 234 to the space between the prism 202 and the hologram mask 200 for the period during which the flow path pump 236 is in operation. It is also applicable to perform the determination of the liquid quantity at the same detection point again after the index matching liquid is supplied, and check whether or not the sufficient quantity of the index matching liquid has been supplied. It is also possible to feedback the results of the determination of the liquid quantity to stop the flow path pump as soon as the liquid quantity is restored, instead of determining the driving period of the flow path pump 236 in advance.

According to exemplary Embodiment 3, since it is determine that one of the optical components, which should oppose each other, is not mounted when the reflecting point identified when the inspection point is at the center of the exposure area satisfies predetermined conditions, an alarm signaling that the hologram mask should be mounted may be issued. Prior to the liquid quantity determination, the presence of the hologram mask can be checked.

According to exemplary Embodiment 3, since the liquid quantity is determined in the area around the exposure area, the minimum necessary quantity of the index matching liquid may be determined.

In this case, since the filling liquid supplying unit supplies a suitable amount of the index matching liquid after the lack of the liquid quantity is determined, supply of the index matching liquid may be automated, and thus manual replenishment of the index matching liquid, which is difficult to carry out, may be omitted.

Exemplary Embodiment 4

Exemplary Embodiment 4 of the present invention relates to a replenisher storage unit that can be used with the filling liquid supplying unit described above, or independently.

Figure 8:
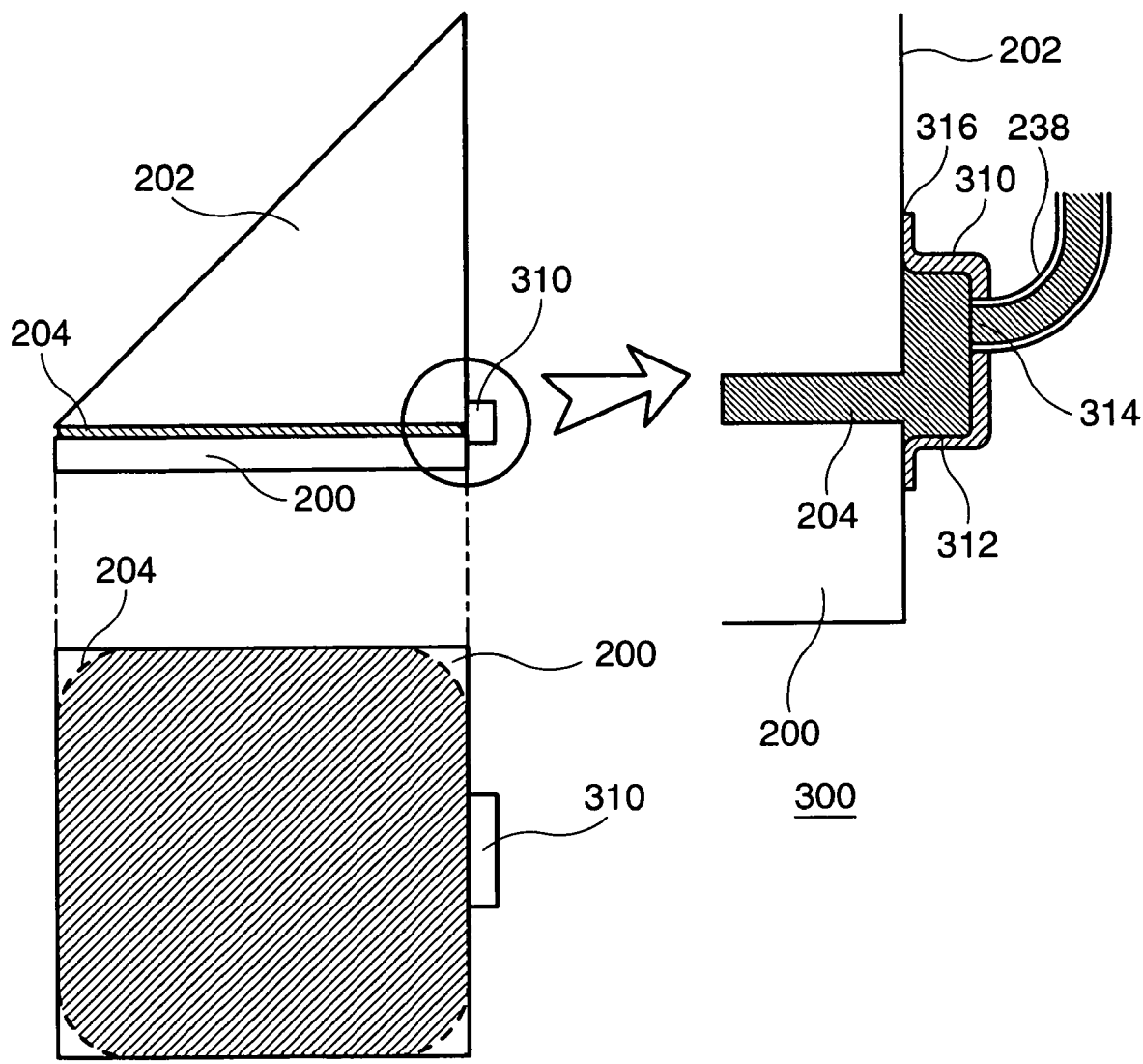
FIG. 8 is a schematic illustrating the structure of a filling liquid storage unit according to exemplary Embodiment 4.

FIG. 8 shows the structure of the replenisher storage unit according to the present exemplary embodiment. As shown in FIG. 8, the replenisher storage unit 300 is mounted at an area where the prism 202 and the hologram mask 200, which are the plurality of optical components, are in abutment with each other while aligning the side surfaces thereof, with a space to be filled with the index matching liquid 204 being interposed therebetween. For example, such a portion is located on the backside of the prism in the holographic photolithography apparatus. It includes a body 310, which is shaped like a handgrip in cross section, and a storage section 312 for storing the index matching liquid therein, which opens toward the end of the space at the area. The body 310 is adhered to the prism 202 with an adhesive agent along an overlap area 316. The length of the body may be the same as or smaller than one side of the prism as long as a certain quantity of the index matching liquid can be stored. When the index matching liquid 204 is filled therein, and the body 310 is mounted to the space, the index matching liquid is constantly supplied from the storage section 312 to the space.

When the replenisher storage unit is used together with the filling liquid supplying unit 230 shown in FIG. 1, for example, an opening 314 is provided on the body 310 and a feed pipe 238 of the filling liquid supplying unit 230 is connected thereto. On the other hand, it is also possible to construct the opening as an openable lid, so that the filling liquid can be manually replenished by a dropping pipette or the like.

According to the replenisher storage unit of the present exemplary embodiment, the quantity of the index matching liquid as a whole can be increased and thus the cycle of maintenance for replenishing the index matching liquid can be elongated, whereby frequent replenishment of the index matching liquid, which is a troublesome operation to carry out, can be avoided.

Exemplary Embodiment 5

Exemplary Embodiment 5 of the present invention relates to a replenisher storage unit that can be used with the filling liquid supplying unit described above, or independently.

Figure 9:
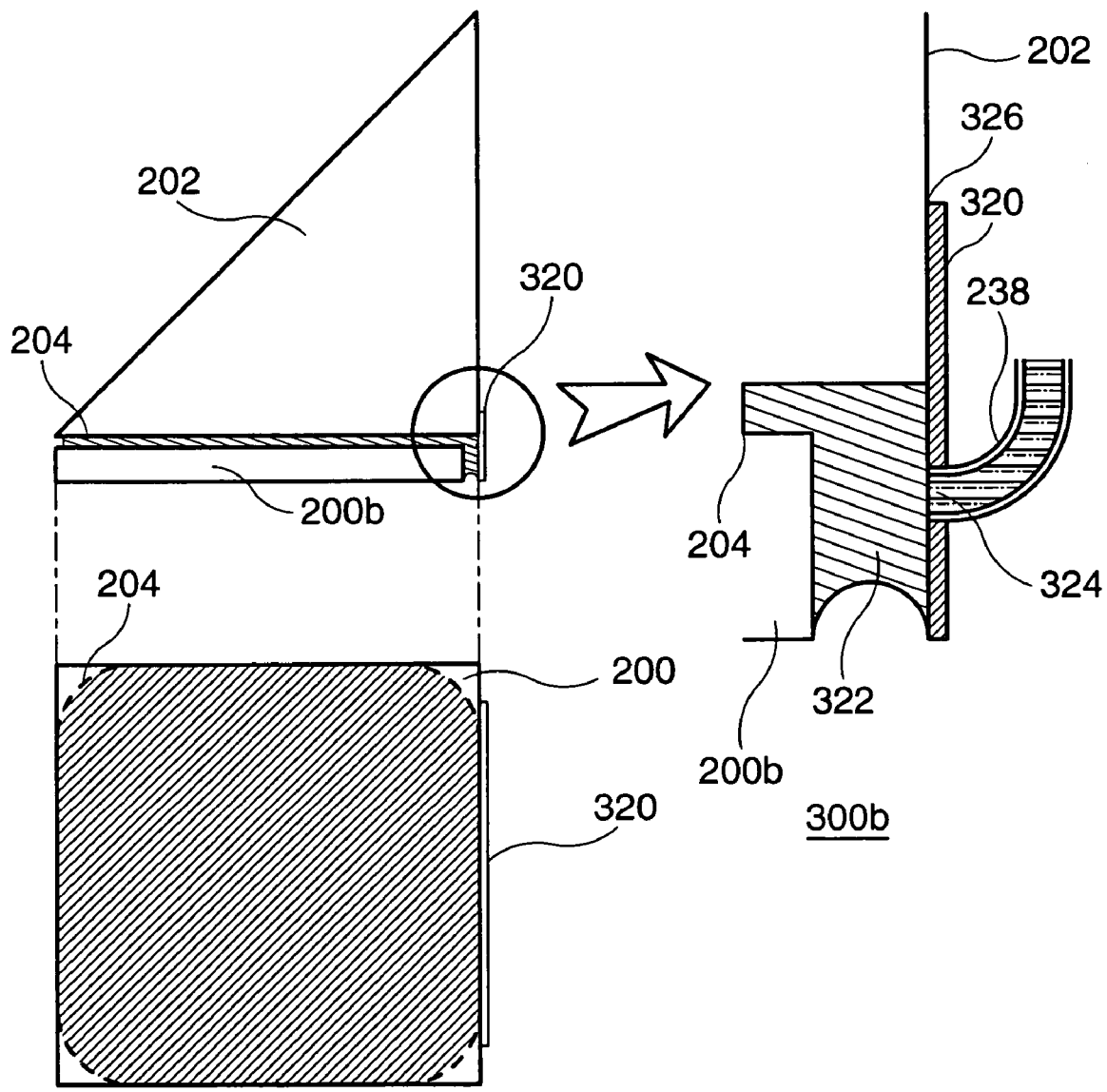
FIG. 9 is a schematic illustrating the structure of the filling liquid storage unit according to exemplary Embodiment 5.

FIG. 9 shows the structure of the replenisher storage unit according to the present exemplary embodiment. As shown in FIG. 9, a replenisher storage unit 300b is provided at an area where the plurality of optical components are in abutment with each other while arranging the side surfaces on the different levels, that is, the size of a hologram mask 200b is slightly smaller than the prism 202. Then an extension plate 320 being overhung from the prism 202 side toward the portion of the optical components arranged on the different levels. The extension plate 320 is adhered to the prism 202 along an overlap area 326. The length of the extension plate may be the same as or smaller than a side of the prism as long as a certain quantity of the index matching liquid can be stored. The index matching liquid is stored by use of a surface tension and its viscosity in a storage space 322 defined by the extension plate 320, the bottom of the prism 202, and the side surface of the hologram mask. In this arrangement, the index matching liquid is supplied to the space constantly from the storage space 322.

When the replenisher storage unit is used together with the filling liquid supplying unit 230 shown in FIG. 1, for example, an opening 324 is formed on the extension plate 320 and the feed pipe 238 of the filling liquid supplying unit 230 is connected thereto. On the other hand, it is also possible to construct the opening as an openable lid, so that the filling liquid can be manually replenished by a dropping pipette or the like.

According to the replenisher storage unit of the present exemplary embodiment, the quantity of the index matching liquid can be increased as a whole and thus the cycle of maintenance to replenish the index matching liquid can be elongated, whereby frequent replenishment of the index matching liquid, which is a troublesome operation to carry out, can be avoided.

Exemplary Embodiment 6

Exemplary Embodiment 6 of the present invention relates to a replenisher storage unit that can be used with the filling liquid supplying unit described above, or independently.

Figure 10:
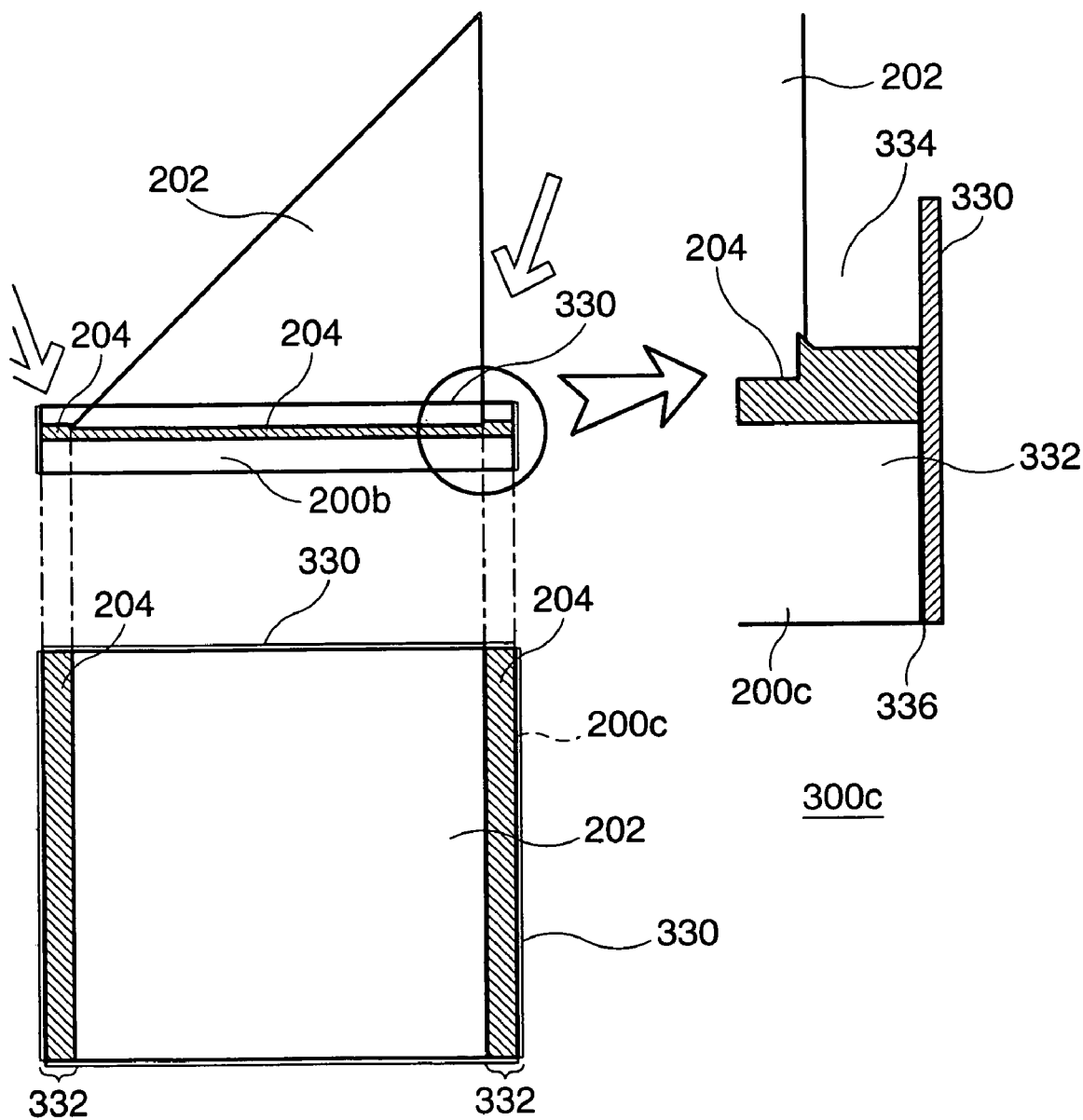
FIG. 10 is a schematic illustrating the structure of the filling liquid storage unit according to exemplary Embodiment 6.

FIG. 10 shows the structure of the replenisher storage unit according to the present exemplary embodiment. As shown in FIG. 10, in a replenisher storage unit 300c, the lower optical component of the plurality of optical components, that is, a hologram mask 200c, is projected at a shelf 332, and an overflow preventing fence 330 is provided on the side surface of the shelf. It is adapted that the index matching liquid stored in a space 334 defined by the shelf 332 and the overflow preventing fence 330 can be supplied from the end of the space. The overflow preventing fence 330 is adhered to the periphery of the hologram mask 200c. This fence does not have to cover the periphery of the hologram mask, and thus it can be provided on the part of it, that is, on one of the sides, as long as a suitable quantity of the index matching liquid can be stored.

When the replenisher storage unit is used together with the filling liquid supplying unit 230 shown in FIG. 1, for example, it is constructed in such a manner that the index matching liquid is supplied from the feed pipe 238 of the filling liquid supplying unit 230 to the space 334 on top of the shelf 332. It is also applicable to form an opening on the side surface of the overflowing preventing means so that the index matching liquid can be supplied therefrom. According to the present exemplary embodiment, since the space 334 is opened upward, the filling liquid can be manually replenished relatively easily by a dropping pipette or the like.

According to the replenisher storage unit of the present exemplary embodiment, the quantity of the index matching liquid can be increased as a whole, and the cycle of the maintenance for replenishing the index matching liquid can be elongated, whereby frequent replenishment of the index matching liquid, which is a troublesome operation to carry out, can be avoided.

(Other Exemplary Modifications)

The present invention is not limited to the exemplary embodiments described above, and may be modified.

For example, in the aforementioned exemplary embodiment, an application of the holographic photolithography apparatus is shown. However, it is not limited thereto, and the present invention can be used in other exposing methods.

The structure for determining the quantity of the filling liquid and the structure to supply the filling liquid are not limited to the distance measuring method in the exemplary embodiments; various related art or known technologies can be applied.

Likewise, the filling liquid storage unit is not limited to the exemplary embodiments described above, and may be modified in various says.

[Advantages]

According to the present invention, since a structure to determine the presence or absence of a filling liquid to be filled between a plurality of optical components is provided, manual inspection of the quantity of the filling liquid, which is a troublesome operation, can be avoided, and the fact that the liquid quantity is insufficient is automatically determined, so that the filling liquid can be replenished, if required.

According to the present invention, since a structure for storing the filling liquid at the portion in communication with the space between the optical components is provided, the total quantity of the filling liquid can be increased, and hence the number of times to replenishments of the filling liquid can be reduced.

The invention claimed is:

1. A liquid quantity determination unit to determine an amount of filling liquid to be filled between a plurality of semiconductor device patterning optical components, an opposed surface of one of a pair of the optical components facing each other with the filling liquid being interposed therebetween, the unit comprising:
    an inspection beam emitting unit to emit an inspection beam substantially vertically to the opposed surface;
    a transporting unit to transport the inspection beam emitting unit to allow the inspection beam emitting unit to emit the inspection beam to a desired inspection point on the opposed surface;
    a reflecting point identifying unit to identify the reflecting point of the inspection beam based on a reflected beam of the inspection beam emitted from the inspection beam emitting unit toward the opposed surface; and
    a computer implemented determination unit to determine the presence or absence of the filling liquid at the inspection point based on the reflecting point identified by the reflecting point identifying unit.

2. The liquid quantity determination unit according to claim 1, the determination unit determining that one of the pair of optical components, which should be opposed, is not mounted when the reflecting point identified when the inspection point is at the central area of the opposed surface satisfies predetermined conditions.

3. The liquid quantity determination unit according to claim 1, the determination unit determining whether or not the quantity of the filling liquid is sufficient based on whether or not the reflecting point which is identified when the inspection point is at the peripheral area of the opposed surface satisfies predetermined conditions.

4. The liquid quantity determination unit according to claim 3, the liquid quantity determination unit further including: a filling liquid supplying unit to supply the filling liquid between the pair of optical components, and the filling liquid supplying unit supplying a predetermined quantity of filling liquid between the optical components when the determination unit determines that the quantity of the filling liquid is not sufficient.

5. The liquid quantity determination unit according to claim 4, wherein the determination unit determining whether or not the quantity of the filling liquid is sufficient for each of a plurality of inspection points on the opposed surface, and the filling liquid supplying unit determining the quantity of filling liquid to be supplied based on the distribution of the inspection points which are determined to have an insufficient quantity of filling liquid.

6. The liquid quantity determination unit according to claim 4, the determination unit determining whether or not the quantity of the filling liquid is sufficient for each of the plurality of inspection points around a predetermined area on the opposed surface, and the filling liquid supplying unit supplying the filling liquid when it is determined that there is an inspection point which is determined to have an insufficient quantity of the filling liquid.

7. A photolithography apparatus, comprising:
    the liquid quantity determination unit according to claim 4, one of the optical components including a hologram mask; and
    an irradiating unit to irradiate the exposure beam to the hologram mask to expose the exposure area.

8. A liquid quantity determination method suitable to determine a quantity of a filling liquid to be filled between a plurality of semiconductor device patterning optical components, comprising:
    emitting an inspection beam substantially perpendicularly to an opposed surface of one of the pair of optical components facing each other, with the filling liquid being interposed therebetween;
    emitting the inspection beam to an arbitrary inspection point on the opposed surface;
    identifying a reflecting point of the inspection beam based on a reflected beam of the inspection beam emitted toward the opposed surface; and
    determining the presence or absence of the filling liquid at the inspection point by computer based on the identified reflecting point.

9. The liquid quantity determination method according to claim 8, the determining including determining that one of the pair of optical components, which should be opposed, is not mounted when the reflecting point identified when the inspection point is at the central area of the opposed surface satisfies predetermined conditions.

10. The liquid quantity determination method according to claim 8, the determining including determining whether or not the quantity of the filling liquid is sufficient based on whether or not the reflecting point identified when the inspection point is at the peripheral area of the opposed surface satisfies predetermined conditions.

11. The liquid quantity determination method according to claim 10, further including:
    supplying the filling liquid between the pair of optical components, and
    supplying a predetermined quantity of filling liquid between the optical components when it is identified, in the determining that the quantity of the filling liquid is not sufficient.

12. The liquid quantity determination method according to claim 11, the determining including determining whether or not the quantity of the filling liquid is sufficient for each of a plurality of inspection points on the opposed surface, and
    the supplying the filling liquid includes determining the quantity of filling liquid to be supplied based on the distribution of the inspection points which are determined to have insufficient quantity of filling liquid.

13. The liquid quantity determination method according to claim 11, the determining including determining whether or not the quantity of the filling liquid is sufficient for each of the plurality of inspection points around the predetermined area on the opposed surface, and
    the supplying including supplying the filling liquid when it is determined that there is an inspection point which is determined to have insufficient quantity of the filling liquid.

* * * * *